(12) United States Patent
Huang et al.

(10) Patent No.: US 9,006,896 B2
(45) Date of Patent: Apr. 14, 2015

(54) CHIP PACKAGE AND METHOD FOR FORMING THE SAME

(71) Applicant: Xintec Inc., Jhongli, Taoyuan County (TW)

(72) Inventors: Yu-Lung Huang, Daxi Township (TW); Tsang-Yu Liu, Zhubei (TW); Shu-Ming Chang, New Taipei (TW)

(73) Assignee: Xintec Inc., Taoyuan (TW)

( * ) Notice: Subject to any disclaimer, the term of this patent is extended or adjusted under 35 U.S.C. 154(b) by 0 days.

(21) Appl. No.: 13/887,917

(22) Filed: May 6, 2013

(65) Prior Publication Data
US 2013/0292825 A1    Nov. 7, 2013

Related U.S. Application Data

(60) Provisional application No. 61/643,718, filed on May 7, 2012.

(51) Int. Cl.
| | |
|---|---|
| *H01L 23/48* | (2006.01) |
| *H01L 23/498* | (2006.01) |
| *H01L 21/78* | (2006.01) |
| *B81B 7/00* | (2006.01) |
| *H01L 21/768* | (2006.01) |
| *H01L 21/683* | (2006.01) |
| *H01L 23/00* | (2006.01) |

(52) U.S. Cl.
CPC .......... *H01L 23/49811* (2013.01); *H01L 21/78* (2013.01); *B81B 7/007* (2013.01); *B81B 2207/092* (2013.01); *B81B 2207/095* (2013.01); *H01L 21/76898* (2013.01); *H01L 24/03* (2013.01); *H01L 24/05* (2013.01); *H01L 24/11* (2013.01); *H01L 24/13* (2013.01); *H01L 21/6836* (2013.01); *H01L 2221/68327* (2013.01); *H01L 2221/6834* (2013.01); *H01L 2221/68372* (2013.01); *H01L 2224/02372* (2013.01); *H01L 2224/05548* (2013.01); *H01L 2224/05567* (2013.01); *H01L 2224/13022* (2013.01); *H01L 2224/13024* (2013.01); *H01L 2224/94* (2013.01); *H01L 2224/13099* (2013.01); *H01L 2924/13091* (2013.01); *H01L 2924/1461* (2013.01); *H01L 2924/00014* (2013.01)

(58) Field of Classification Search
CPC .................. H01L 23/522; H01L 24/12; H01L 2924/1461; H01L 2924/02; H01L 2924/00
USPC .................. 257/529, 737, 758; 438/103–127, 438/612–616, 617–624
See application file for complete search history.

(56) References Cited

U.S. PATENT DOCUMENTS

| | | | |
|---|---|---|---|
| 2008/0073790 A1* | 3/2008 | Burrell et al. | 257/758 |
| 2013/0256878 A1* | 10/2013 | Hsu et al. | 257/737 |

FOREIGN PATENT DOCUMENTS

JP    2012-151475 A    *    8/2012

*Primary Examiner* — Dung Le
(74) *Attorney, Agent, or Firm* — Liu & Liu

(57) ABSTRACT

An embodiment of the invention provides a chip package which includes: a semiconductor substrate having a first surface and a second surface; a device region formed in the semiconductor substrate; a dielectric layer disposed on the first surface of the semiconductor substrate; a conducting pad structure located in the dielectric layer and electrically connected to the device region, wherein the conducting pad structure comprises a stacked structure of a plurality of conducting pad layers; a support layer disposed on a top surface of the conducting pad structure; and a protection layer disposed on the second surface of the semiconductor substrate.

26 Claims, 7 Drawing Sheets

CHIP PACKAGE AND METHOD FOR FORMING THE SAME

CROSS REFERENCE TO RELATED APPLICATIONS

This Application claims the benefit of U.S. Provisional Application No. 61/643,718, filed on May 7, 2012, the entirety of which is incorporated by reference herein.

BACKGROUND OF THE INVENTION

1. Field of the Invention

The present invention relates to a chip package and methods for forming the same, and in particular, relates to a chip package formed by a wafer-level package process.

2. Description of the Related Art

Electronic products are required to be miniaturized more and more. Therefore, chips in chip packages are scaled down (e.g. a thickness).

Thus, improved chip package technology is required to form chip packages with scaled-down chips and avoid the damage of the chips during the packaging process.

BRIEF SUMMARY OF THE INVENTION

An embodiment of the invention provides a chip package which includes: a semiconductor substrate having a first surface and a second surface; a device region formed in the semiconductor substrate; a dielectric layer disposed on the first surface of the semiconductor substrate; a conducting pad structure located in the dielectric layer and electrically connected to the device region, wherein the conducting pad structure comprises a stacked structure of a plurality of conducting pad layers; a support layer disposed on a top surface of the conducting pad structure; and a protection layer disposed on the second surface of the semiconductor substrate.

An embodiment of the invention provides a method for forming a chip package which includes: providing a semiconductor substrate having a first surface and a second surface, wherein the semiconductor substrate is defined by at least one predetermined scribing line dividing the semiconductor substrate into a plurality of regions, wherein each of the regions is formed with a corresponding device region, a dielectric layer is formed on the first surface of the semiconductor substrate, a plurality of conducting pad structure are formed in the dielectric layer, the conducting pad structures are electrically connected to the corresponding device regions respectively, and each of the conducting pad structures comprises a stacked structure of a plurality of conducting pad layers; forming a support layer on a top surface of each of the conducting pad structures; bonding a carrier substrate onto the dielectric layer; thinning the semiconductor substrate from the second surface of the semiconductor substrate; after thinning the semiconductor substrate, forming a protection layer on the second surface of the semiconductor substrate; disposing a fixing structure on the protection layer; after disposing the fixing structure, removing the carrier substrate; after removing the carrier substrate, disposing a carrier on the dielectric layer; after disposing the carrier, removing the fixing structure; and performing a cutting process along the at least one predetermined scribing line to form a plurality of chip packages separated from each other on the carrier.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package various chips. For example, the chip package of the embodiments of the invention may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1A:
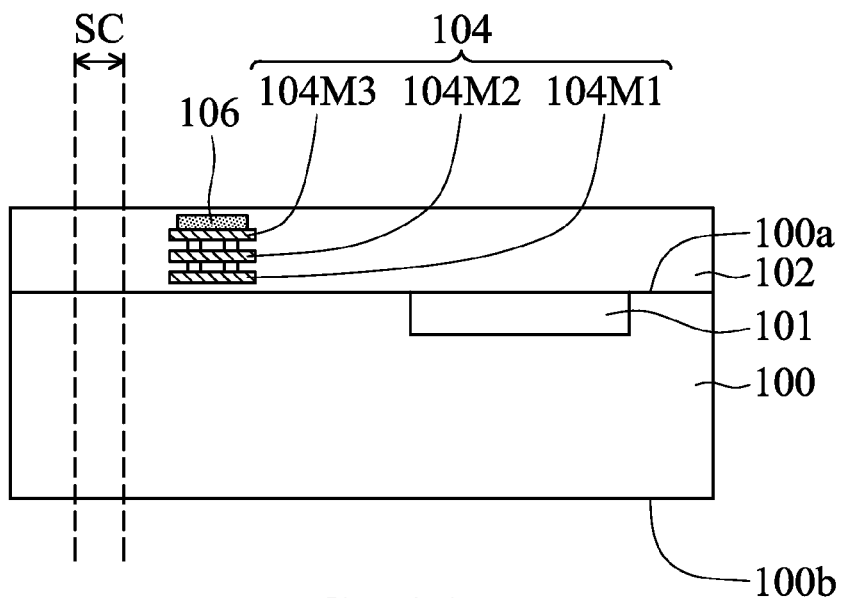
FIGS. 1A-1K are cross-sectional views of a manufacturing process of a chip package according to an embodiment of the present invention.
Figure 3:
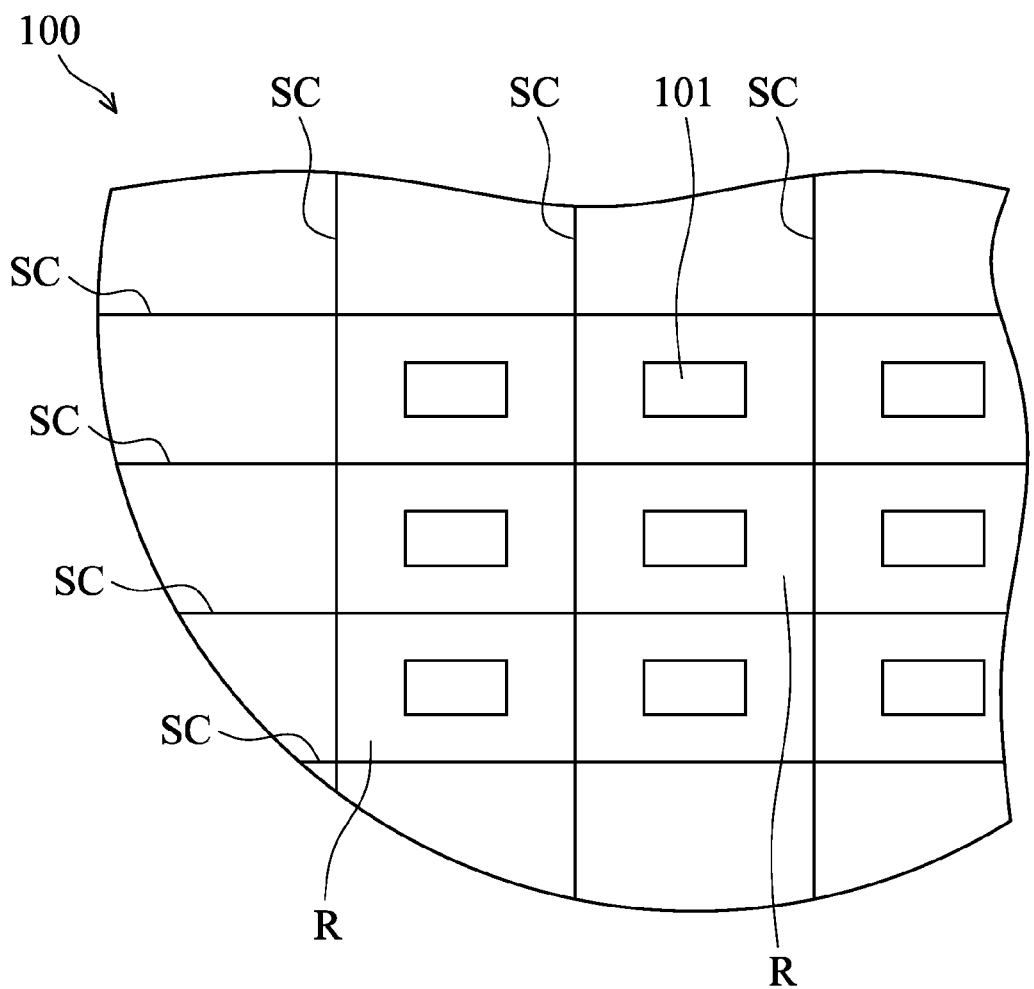
FIG. 3 is a top view of a semiconductor substrate according to an embodiment of the present invention.

FIGS. 1A-1K are cross-sectional views of a manufacturing process of a chip package according to an embodiment of the present invention. As shown in FIG. 1A, a semiconductor substrate 100 is provided, wherein the semiconductor substrate 100 has a surface 100a and a surface 100b. The semiconductor substrate 100 is, for example, a semiconductor wafer (e.g. a silicon wafer). The semiconductor substrate 100 is defined by at least one predetermined scribing line SC dividing the semiconductor substrate 100 into a plurality of regions. FIG. 3 is a top view of a semiconductor substrate according to an embodiment of the present invention. As shown in FIG. 3, the semiconductor substrate 100 may be divided into a plurality of regions R by the predetermined scribing lines SC. Each of the regions R is formed with a corresponding device region 101. There are various devices which may be formed in the device region 101, wherein the devices are, for example but not limited to, optoelectronic devices (e.g. image sensing devices).

A dielectric layer 102 may be formed on the surface 100a of the semiconductor substrate 100. A plurality of conducting pad structure 104 are formed in the dielectric layer 102, and the conducting pad structures 104 are electrically connected to the corresponding device regions 101 respectively. In one embodiment, each of the conducting pad structures 104 may include a stacked structure of a plurality of conducting pad layers (e.g. the conducting pad layers 104M1, 104M2 and 104M3).

Then, a support layer 106 may be formed on a top surface of each of the conducting pad structures 104 (e.g. the top surface of the conducting pad layer 104M3). In one embodiment, the thickness of the support layer 106 is larger than the thickness of any conducting pad layer 104M1, 104M2 or 104M3. It should be noted that, in other embodiments, the thickness of the support layer 106 may be not larger than the thickness of any conducting pad layer 104M1, 104M2 or 104M3. The support layer 106 may improve the structural strength of the conducting pad structure 104. The support layer 106 may include metal, polymers, semiconductors, ceramics, or combinations thereof. The support layer 106 may be located in the dielectric layer 102.

In one embodiment, a portion of the dielectric layer 102 may be removed to expose a portion of the top surface of the conducting pad structure 104. Then, a material layer may be formed on the exposed top surface to form the support layer 106, wherein the material layer is, for example, a metal layer, a polymer layer, a semiconductor layer, a ceramic layer, or combinations thereof. In another embodiment, after forming the support layer 106, a dielectric material may be optionally formed on the support layer 106 such that the dielectric layer 102 may have a top surface which is substantially flat. In one embodiment, the support layer 106 may have a material which is the same as that of the conducting pad structure 104. In another embodiment, the support layer 106 may have a material which is different from that of the conducting pad structure 104. In one embodiment, the support layer 106 may directly contact the conducting pad structure 104. The area of the support layer 106 may be less than the area of the top surface of the conducting pad structure 104.

Figure 1B:
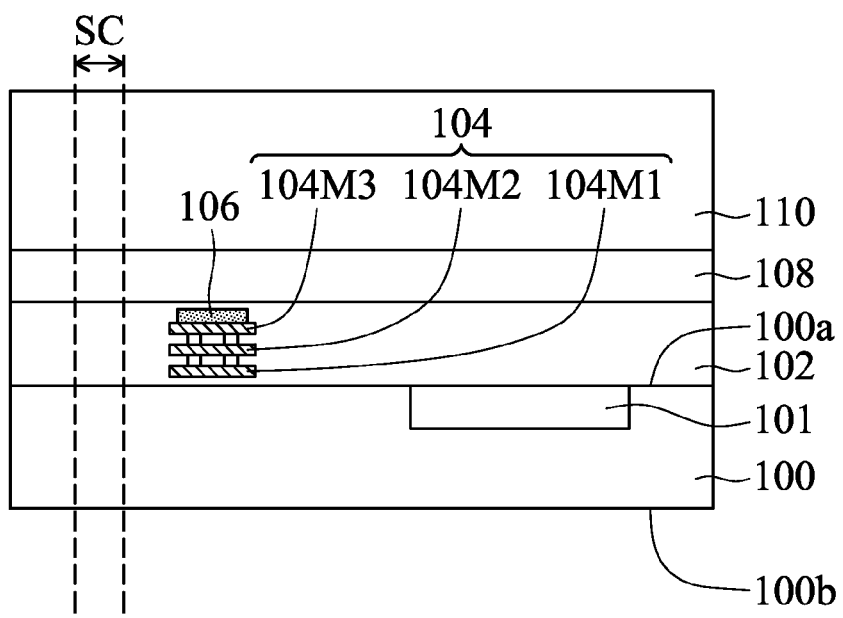

Then, as shown in FIG. 1B, a carrier substrate 110 is bonded onto the dielectric layer 102. For example, the carrier substrate 110 is bonded onto the dielectric layer 102 by using an adhesive layer 108. The carrier substrate 110 is, for example, a semiconductor substrate, a glass substrate, a polymer substrate, a metal substrate, or combinations thereof. Then, by using the carrier substrate 110 as a support, the semiconductor substrate 100 is thinned from the surface 100b of the semiconductor substrate 100. A suitable thinning process may include a mechanical polishing process, a chemical-mechanical polishing process, an etching process, or combinations thereof. The semiconductor substrate 100 may be thinned to a thickness of about 50 µm to about 150 µm. Alternatively, the thickness of the thinned semiconductor substrate 100 may range from about 20 µm to about 250 µm.

Figure 1C:
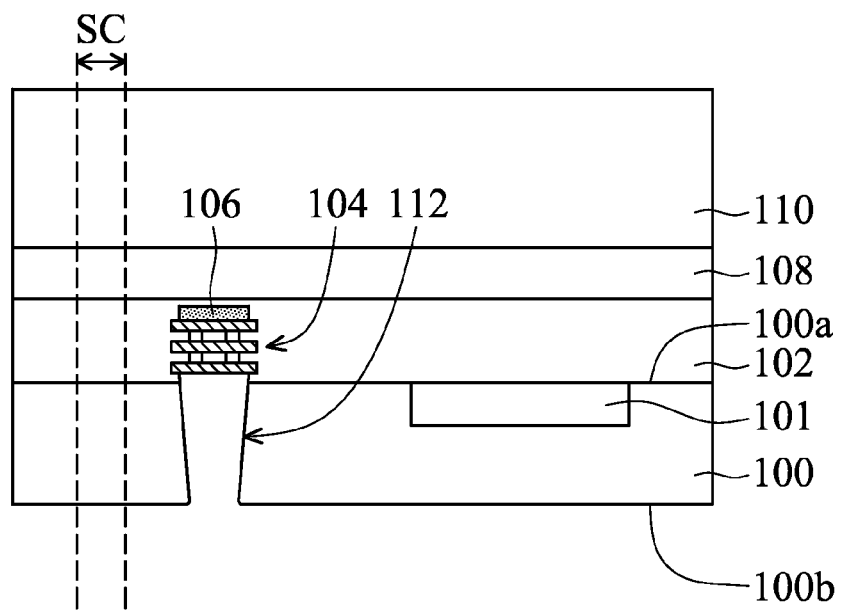

As shown in FIG. 1C, a portion of the semiconductor substrate 100 may be optionally removed from the surface 100b of the semiconductor substrate 100 to form a plurality of holes 112 extending toward the conducting pad structure 104, wherein only one of the holes 112 is shown in the figures. In one embodiment, the holes 112 extending toward the conducting pad structure 104 may be formed by an etching process, wherein the holes 112 may expose the dielectric layer 102 on the conducting pad structure 104. Then, the exposed dielectric layer 102 may be etched away to expose the conducting pad structure 104. In one embodiment, the sidewall of the hole 112 is inclined with respect to the surface 100b of the semiconductor substrate 100 by modifying the etching process parameters, such that the lower diameter of the hole 112 adjacent to the surface 100b is less than the upper diameter of the hole 112 adjacent to the surface 100a. That is, the diameter of the hole 112 increases gradually from the opening adjacent to the surface 100b to the bottom of the hole 112. It should be noted that, the present invention is not limited thereto. In other embodiment, the sidewall of the hole 112 may be substantially perpendicular to the surface 100b. Alternatively, the diameter of the hole 112 decreases gradually from the opening adjacent to the surface 100b to the bottom of the hole 112. The description below illustrates the example where the diameter of the hole 112 increases gradually from the opening adjacent to the surface 100b to the bottom of the hole 112.

Figure 1D:
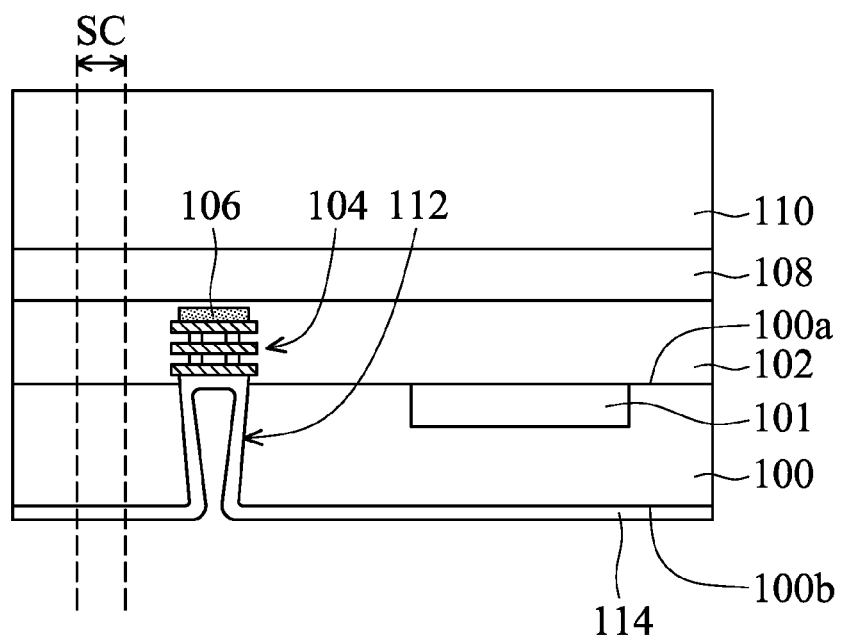

As shown in FIG. 1D, an insulating layer 114 may be formed on the surface 100b of the semiconductor substrate 100 and the sidewall of the hole 112. The insulating layer 114 may cover the surface 100b, the sidewall of the hole 112 and the conducting pad structure 104. In one embodiment, the thickness of the insulating layer 114 may decrease gradually from the opening of the hole 112 adjacent to the surface 100b to the conducting pad structure 104.

Figure 1E:
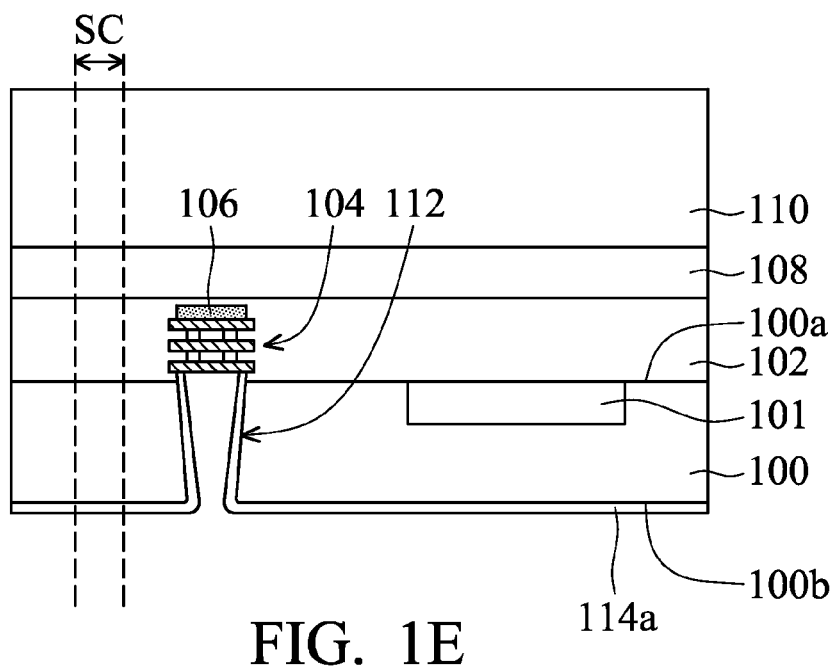

As shown in FIG. 1E, the insulating layer 114 located on the bottom of the hole 112 is required to be removed to expose the conducting pad structure 104, such that a wiring layer formed subsequently may be electrically connected to the conducting pad structure 104. In one embodiment, because the thickness of the insulating layer 114 located at the opening of the hole 112 is large, the insulating layer 114 located at the opening may be used as a mask. Thus, an etching process may be directly performed to the insulating layer 114 without disposing a patterned mask on the insulating layer 114 to form an insulating layer 114a exposing the conducting pad structure 104. The insulating layer 114a is thinner than the insulating layer 114. The portion of the insulating layer 114 located at the bottom of the hole 112 is thinner than other portions of the insulating layer 114, so even if the conducting pad structure 104 located at the bottom of the hole 112 is exposed, the insulating layer 114a will still be left to remain on the sidewall of the hole 112.

Figure 1F:
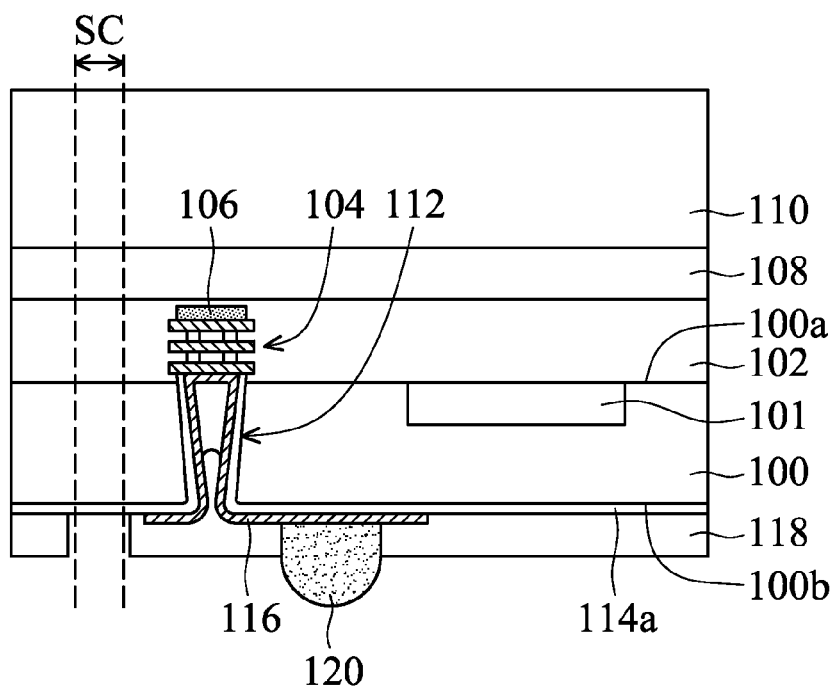

Then, as shown in FIG. 1F, a plurality of wiring layers 116 is formed on the surface 100b of the semiconductor substrate 100, wherein only one of the wiring layers 116 is shown in the figures. The wiring layers 116 respectively extend onto the sidewalls of the corresponding holes 112 and are respectively electrically connected to the corresponding conducting pad structures 104. In one embodiment, a seed layer may be formed on the insulating layer 114a. Then, a patterned mask layer may be formed on the seed layer to cover the region of the seed layer without the need to form a wiring layer thereon. Then, a conductive material may be deposited on the exposed seed layer by an electro-plating process, a chemical plating process, or the combinations thereof. Then, the patterned mask layer may be removed and an etching process may be performed to thin the deposited conductive material and may etch away the seed layer covered by the patterned mask layer to form the wiring layers 116.

It should be noted that, the formation of the holes 112 and the wiring layers 116 are optional. There are other conductive structures which may be electrically connected to the conducting pad structures 104.

Then, a protection layer 118 may be formed on the surface 100b of the semiconductor substrate. In one embodiment, the protection layer 118 does not fully fill the holes 112 and thus cavities are left. In another embodiment, the protection layer 118 fully fills the holes 112. In one embodiment, portions of the protection layer 118 may be removed to form a plurality of openings exposing the wiring layers 116. Then, a plurality of conductive bumps 120 passing through the protection layer 118 are formed on the exposed wiring layer 116. The conductive bumps 120 may electrically contact the corresponding wiring layers 116.

Figure 1G:
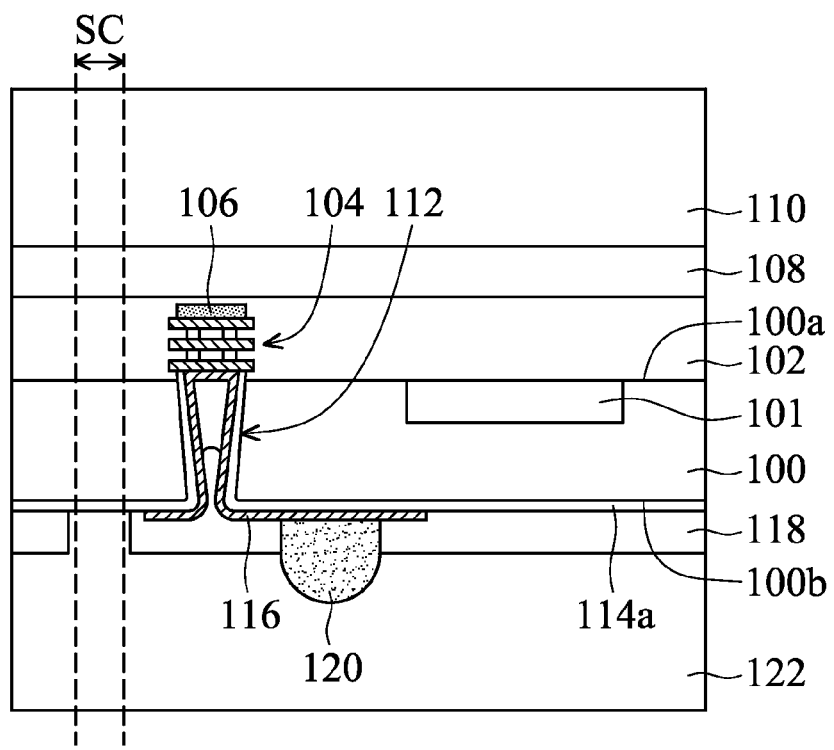

As shown in FIG. 1G, a fixing structure 122 is disposed on the protection layer 118. In the embodiment that the conductive bumps 120 are formed, the conductive bumps 120 may penetrate into the fixing structure 122. The fixing structure 122 is, for example, a UV tape.

Figure 1H:
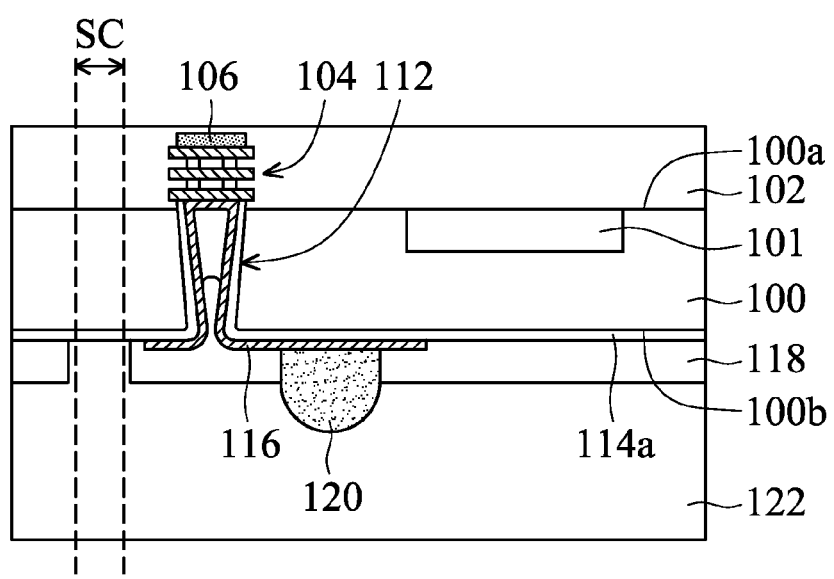

As shown in FIG. 1H, the carrier substrate 110 and the adhesive layer 108 may be removed after disposing the fixing structure 122.

Figure 1I:
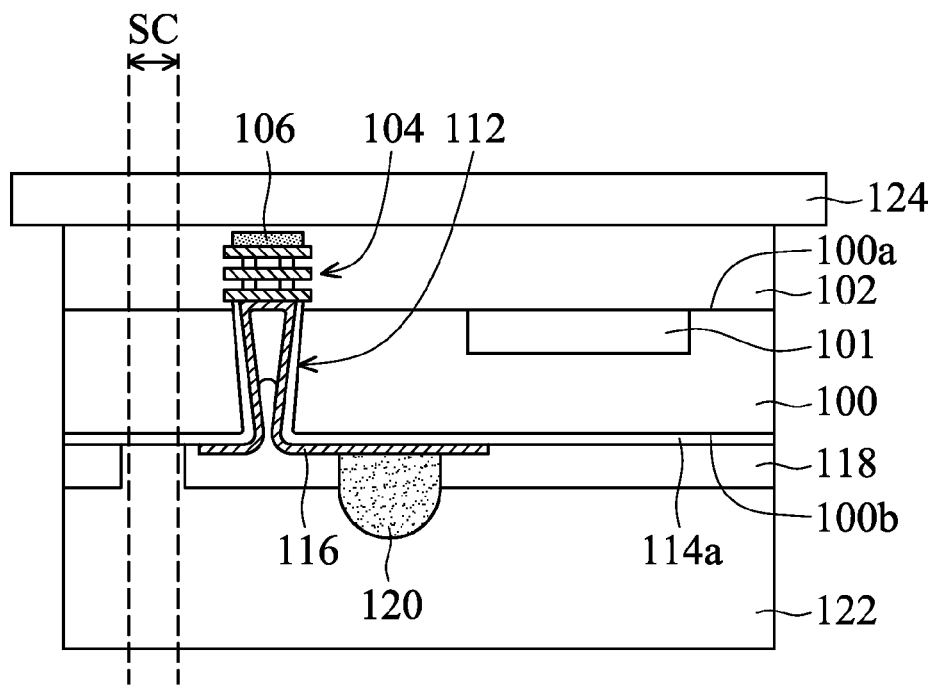

As shown in FIG. 1I, a carrier 124 may be disposed on the dielectric layer 102 after removing the carrier substrate 110. The carrier 124 is, for example, a pellicle frame carrier with a UV tape, which may adhere to the formed chip package.

Figure 1J:
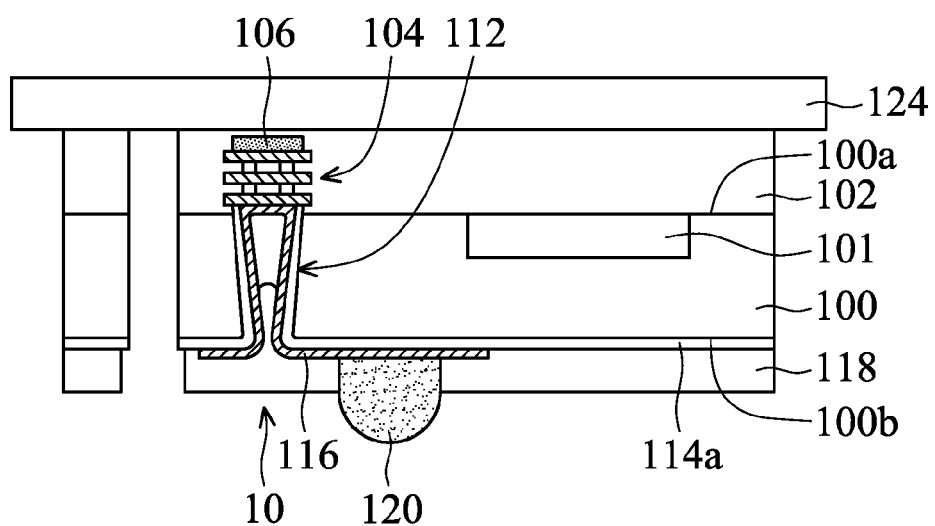
Figure 2:
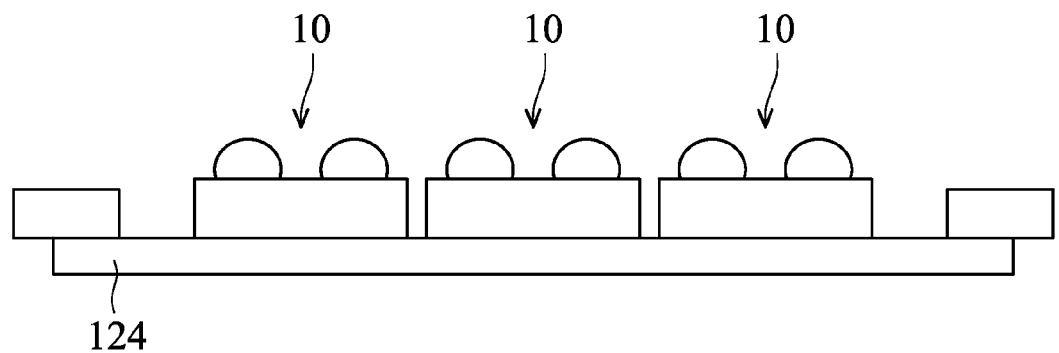
FIG. 2 is a cross-sectional view of a chip package according to an embodiment of the present invention.

As shown in FIG. 1J, the fixing structure 122 may be removed after disposing the carrier 124. In one embodiment, the fixing structure 122 may be exposed to a light (e.g. a UV light) to remove the fixing structure 122. Then, a cutting process is performed along the predetermined scribing lines SC to form a plurality of chip packages 10 separated from each other on the carrier 124. FIG. 2 is a cross-sectional view of a chip package according to an embodiment of the present invention, wherein the chip package is similar to the structure in the FIG. 1J.

Figure 1K:
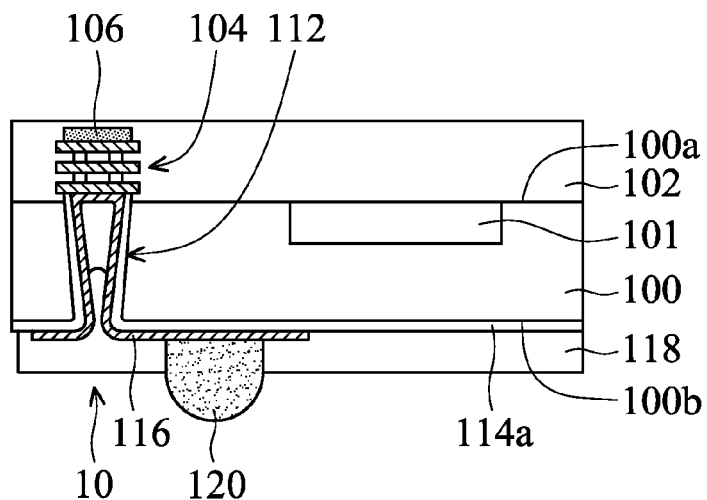

As shown in FIG. 1K, in one embodiment, the chip packages 10 may be removed from the carrier 124. For example, the chip packages 10 may be removed by cutting through the carrier 124. In one embodiment, the portion of the carrier 124 corresponding to the scribing lines SC may be exposed to a UV light, and then the carrier 124 is cut therethrough. The carrier 124 may include a UV tape, and the carrier 124 may be hardened after being exposed to the UV light, which benefits the cutting of the carrier 124. Then, the UV tape left on the chip packages 10 may be removed. The chip package 10 may include the semiconductor substrate 100 with the surfaces 100a and 100b, the device regions 101 formed in the semiconductor substrate 100, the dielectric layer 102 disposed on the surface 100a of the semiconductor substrate 100, the conducting pad structures 104 in the dielectric layer 102 and electrically connected to the device regions 101, the support layers 106 on the top surface of the conducting pad structure 104, and the protection layer 118 disposed on the surface 100b of the semiconductor substrate 100.

In the present embodiment, the semiconductor substrate 100 in the chip package 10 is thinned for operation. In this case, the support layers 106 may improve the structural strength of the conducting pad structures 104, which decreases the probability for damage of the chip package 10 after the thinning process. Also, in one embodiment, the diameter of the hole 112 increases gradually from the opening to the conducting pad structure 104, so the present embodiment has no need to perform a patterning process of the insulating layer. Additionally, the manufacturing cost and the manufacturing time may be reduced, and the process steps, including transport, required for forming the chip package 10 may be reduced, which effectively decreases the probability for damage of the chip package 10 during processing.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a semiconductor substrate having a first surface and a second surface;
a device region formed in the semiconductor substrate;
a dielectric layer disposed on the first surface of the semiconductor substrate;
a conducting pad structure located in the dielectric layer and electrically connected to the device region, wherein the conducting pad structure comprises a stacked structure of a plurality of conducting pad layers; and
a material layer disposed on a top surface of the conducting pad structure.

2. The chip package as claimed in claim 1, wherein the material layer directly contacts the top surface of the conducting pad structure.

3. The chip package as claimed in claim 1, wherein the area of the material layer is less than the area of the top surface of the conducting pad structure.

4. The chip package as claimed in claim 1, wherein the material layer comprises a metal layer, a polymer layer, a semiconductor layer, a ceramic layer, or combinations thereof.

5. The chip package as claimed in claim 1, further comprising:
a conductive external connection disposed on the second surface of the semiconductor substrate, wherein the conductive external connection is electrically connected to the conducting pad structure.

6. The chip package as claimed in claim 5, further comprising:
a hole extending from the second surface of the semiconductor substrate to the conducting pad structure;
a wiring layer disposed on a sidewall of the hole and electrically connected to the conducting pad structure and the conductive external connection; and
an insulating layer disposed between the wiring layer and the semiconductor substrate.

7. The chip package as claimed in claim 6, wherein a lower diameter of the hole adjacent to the second surface is less than an upper diameter of the hole adjacent to the first surface.

8. The chip package as claimed in claim 1, wherein the semiconductor substrate has a thickness ranging from about 50 μm to about 150 μm.

9. The chip package as claimed in claim 1, wherein the material layer is located in the dielectric layer.

10. The chip package as claimed in claim 1, wherein the dielectric layer has a top surface which is substantially flat.

11. The chip package as claimed in claim 1, wherein the material layer is a support layer and a thickness of the support layer is larger than a thickness of any one of the conducting pad layers.

12. A method for forming a chip package, comprising:
providing a semiconductor substrate having a first surface and a second surface, wherein the semiconductor substrate is defined by at least one predetermined scribing line dividing the semiconductor substrate into a plurality of regions, each of the regions is formed with a corresponding device region, a dielectric layer is formed on the first surface of the semiconductor substrate, a plurality of conducting pad structure are formed in the dielectric layer, the conducting pad structures are electrically connected to the corresponding device regions respectively, and each of the conducting pad structures comprises a stacked structure of a plurality of conducting pad layers;
forming a material layer on a top surface of each of the conducting pad structures;
bonding a carrier substrate onto the dielectric layer;
thinning the semiconductor substrate from the second surface of the semiconductor substrate;
disposing a fixing structure on the second surface of the semiconductor substrate;
after disposing the fixing structure, removing the carrier substrate;
after removing the carrier substrate, disposing a carrier on the dielectric layer;
after disposing the carrier, removing the fixing structure; and
performing a cutting process along the at least one predetermined scribing line to form a plurality of chip packages separated from each other on the carrier.

13. The method for forming a chip package as claimed in claim 12, wherein material layer comprises:
a metal layer, a polymer layer, a semiconductor layer, a ceramic layer, or combinations thereof.

14. The method for forming a chip package as claimed in claim 13, further comprising:
after forming the material layer, forming a dielectric material on the material layer such that the dielectric layer has a top surface which is substantially flat.

15. The method for forming a chip package as claimed in claim 12, further comprising:
disposing a plurality of conductive external connections on the second surface of the semiconductor substrate, wherein the conductive external connections are electrically connected to the corresponding conducting pad structures respectively.

16. The method for forming a chip package as claimed in claim 15, wherein the conductive external connections penetrate into the fixing structure.

17. The method for forming a chip package as claimed in claim 15, further comprising:
after thinning the semiconductor substrate, removing a portion of the semiconductor substrate from the second surface of the semiconductor substrate to form a plurality of holes extending toward the conducting pad structures;
forming an insulating layer on the second surface of the semiconductor substrate and sidewalls of the holes; and
forming a plurality of wiring layers on the second surface of the semiconductor substrate, wherein the wiring layers respectively extend onto the sidewalls of the corresponding holes to be electrically connected to the corresponding conducting pad structures respectively.

18. The method for forming a chip package as claimed in claim 17, wherein the conductive external connections electrically contact the corresponding wiring layers respectively after forming the conductive external connections.

19. The method for forming a chip package as claimed in claim 17, wherein a lower diameter of the hole adjacent to the second surface is less than an upper diameter of the hole adjacent to the first surface.

20. The method for forming a chip package as claimed in claim 12, wherein the removing of the fixing structure comprises:
exposing the fixing structure to a UV light.

21. The method for forming a chip package as claimed in claim 12, further comprising:
removing the chip packages from the carrier.

22. The method for forming a chip package as claimed in claim 12, wherein a thickness of the material layer is larger than a thickness of any one of the conducting pad layers.

23. The chip package as claimed in claim 1, wherein the stacked structure and the material layer are completely embedded in the dielectric layer without protruding above a top surface of the dielectric layer.

24. The chip package as claimed in claim 1, wherein the material layer does not directly electrically connect to another structure other than the conducting pad structure.

25. The method for forming a chip package as claimed in claim 12, wherein the stacked structure and the material layer are completely embedded in the dielectric layer without protruding above a top surface of the dielectric layer.

26. The method for forming a chip package as claimed in claim 12, wherein the material layer does not directly electrically connect to another structure other than the conducting pad structure.

* * * * *